United States Patent [19]
Martinez

[11] Patent Number: 5,880,642
[45] Date of Patent: Mar. 9, 1999

[54] PROGRAMMABLE FREQUENCY SYNTHESIZER HAVING A LOW SENSITIVITY TO PHASE NOISE

[75] Inventor: Georges Martinez, Caen, France

[73] Assignee: U.S. Philips Corporation, New York, N.Y.

[21] Appl. No.: 976,519

[22] Filed: Nov. 21, 1997

[30] Foreign Application Priority Data

Dec. 3, 1996 [FR] France .................................. 96 14797

[51] Int. Cl.$^6$ .................................................. H03L 7/085
[52] U.S. Cl. ................................... 331/25; 327/7; 331/27
[58] Field of Search ............................. 331/25, 27; 327/7

[56] References Cited

U.S. PATENT DOCUMENTS

| | | | |
|---|---|---|---|
| 4,864,253 | 9/1989 | Zwack | 331/25 |
| 5,621,485 | 4/1997 | Terao et al. | 348/735 |
| 5,652,769 | 7/1997 | Hiramatsu | 329/308 |

FOREIGN PATENT DOCUMENTS

0727877A2  8/1996  European Pat. Off. .

*Primary Examiner*—Siegfried H. Grimm
*Attorney, Agent, or Firm*—Laurie E. Gathman

[57] ABSTRACT

A frequency synthesizer SYNT intended to supply an output signal Sout having an output frequency which depends on the average frequency, referred to as symbol frequency, of an input signal Sin beset with a strong phase noise. This synthesizer SYNT includes: a phase/frequency detector PHD comparing the symbol frequency with a predetermined fraction of the output frequency, and supplying a control signal; a low-pass filter LPF filtering the control signal; and an oscillator VCO supplying a signal Sout with a frequency which is adjusted by the filtered control signal Cs. Reference pulses having the symbol frequency are generated within the synthesizer SYNT by means of pulses from an internal clock, which pulses are validated by active states of the input signal Sin.

7 Claims, 2 Drawing Sheets

PROGRAMMABLE FREQUENCY SYNTHESIZER HAVING A LOW SENSITIVITY TO PHASE NOISE

BACKGROUND OF THE INVENTION

The invention relates to a frequency synthesizer intended to receive an input signal having an average frequency referred to as symbol frequency, a clock signal having a fixed frequency, and to supply an output signal having a frequency referred to as output frequency, said synthesizer comprising:

a phase/frequency detector intended to compare the symbol frequency with a predetermined fraction of the output frequency and to supply a control signal for adjusting the value of said output frequency, a low-pass filter having an output and an input intended to receive the control signal, an oscillator having a control input which is connected to the output of the low-pass filter and an output which is intended to supply the output signal of the synthesizer whose output frequency depends on the signal at the control input.

A frequency synthesizer of this type is known from European patent application EP 0 727 877 A2. This synthesizer comprises first and second programmable dividers which supply signals at the output whose frequencies have a first and a second software-programmable division rate with respect to the output frequency and with respect to the symbol frequency, respectively. The frequencies of the output signals of the programmable dividers are compared by means of a phase/frequency detector which supplies a control signal intended to adjust the output frequency in order that the ratio between this frequency and the symbol frequency is equal to the ratio between the first and second division rates. Here, the input signal of this synthesizer is a reference signal having a frequency which is known and invariable and constituting the symbol frequency. In certain applications, particularly in the reception of signals from a communication network, the input signal, elaborated on the basis of said signals, may have a phase noise which becomes manifest by variations of the cyclic ratio and of the frequency around an average frequency which corresponds to the symbol frequency. The active edges of such a signal can thus no longer serve as reference pulses, as is the case in the known frequency synthesizer described above.

SUMMARY OF THE INVENTION

It is an object of the present invention to remedy this drawback by providing a frequency synthesizer in which active edges of the clock signal validated by active logic states of the input signal constitute the reference pulses whose average frequency is the symbol frequency.

To this end, a frequency synthesizer according to the invention is characterized in that the phase/frequency detector comprises:

a time delay module intended to supply a signal referred to as end-of-cycle signal assuming an active state at the end of a period referred to as counting cycle which is equal to the multiplication of the duration of a period of the output signal of the synthesizer by a first predetermined digital value, a counting device having a clock input which is intended to receive the clock signal, an output having a value which is incremented, when the counting device is activated, at each new period of said clock signal, the counting device being only activated when the input signal of the synthesizer has an active logic state, the value of the output of the counting device being re-initialized when the end-of-cycle signal is in the active state, comparison means allowing a comparison of the value obtained at the output of the counting device at the of the counting cycle with a second predetermined digital value, the result of this comparison being used for generating the control signal.

In such a frequency synthesizer, the counting device measures the number of reference pulses, whose average frequency is the symbol frequency denoted Fsym, occurring during a counting cycle, whose duration is limited by the first predetermined digital value Ref1 and depends on the period of the output signal. If, in a transitory mode, this number of reference pulses is lower than the second predetermined digital value Ref2, the control signal acts on the oscillator in such a way that the output frequency becomes sufficiently low for the value obtained at the output of the counting device to be equal to the second predetermined digital value, in a permanent mode reached at the end of a certain number of counting cycles. The conditions for obtaining this permanent mode may thus be defined by the equation Fout=Fsym.Ref1/Ref2. The values of Ref1 and Ref2 which may be provided, for example, by registers which are programmable by means of software, allow adjustment with a great flexibility of the value of the output frequency of the synthesizer.

An embodiment of the invention relates to a frequency synthesizer as described above, which is characterized in that the counting device comprises a first counter provided with a clock input which is intended to receive the clock signal, an output constituting the output of the counting device, a counting enable input intended to receive the input signal, a load input whose least significant bit is coupled to said enable input and whose other bits are placed in the inactive logic state, and a re-initialization input intended to receive the end-of-cycle signal, an active state of which controls the loading at the output of the counter with the value present at its load input.

The re-initialization mode used in such a counting device allows keeping track of an active state of the input signal which, in the case of an unconditional reset-to-zero of the first counter at the end of the counting cycle, would not be registered by the counter if the end of the counting cycle occurred before the active edge of the clock signal. The result would be an error between the frequency of the reference pulses and the real value of the symbol frequency.

In another embodiment of the invention, a frequency synthesizer according to the invention is characterized in that the comparison means included in the phase/frequency detector comprise a first digital subtracter having a first input which is intended to receive the output of the counting device, a second input which is intended to receive the second predetermined digital value, and an output connected to a first register memorizing the state of said output at the start of each counting cycle, said first register being intended to supply a signal used for generating the control signal.

Operating a subtraction rather than a simple comparison between the output of the counting device and the second predetermined digital value gives information about the magnitude of the correction to be performed on the output frequency, which enables the synthesizer to reach the permanent mode more rapidly.

In a particular embodiment of the invention, a frequency synthesizer as described above is characterized in that the time delay module comprises a second counter provided with a clock input which is intended to receive the output signal of the synthesizer, a zero-reset input and an output, a digital comparator having a first input which is intended to receive the first predetermined digital value, a second input connected to the output of the second counter, and an output connected to the zero-reset input and intended to supply the end-of-cycle signal which assumes an active state when the signals received at the inputs of the comparator have equal values.

The signal stored in the first register is constituted by a certain number of bits, only some of which are significant in the normal operating mode of the synthesizer. Indeed, the closer the synthesizer gets to its permanent mode, the smaller the differences between the magnitudes of the successive corrections become. It may thus be advantageous to provide, within the control module, a device performing a comparison between the contents of the first register at the end of a counting cycle and the magnitude of the correction required at the end of the preceding cycle.

A variant of the invention thus provides a frequency synthesizer as described above, which is characterized in that the phase/frequency detector includes a control module comprising a second register which has a data output from which the control signal is derived, and a second digital subtracter having a first input which is connected to the data output of the first register, a second input which is connected to the data output of the second register, and an output whose state is memorized in the second register in rhythm with the frequency of the clock signal.

A compromise has to be found between the precision of the correction which one wishes to obtain, which is expressed by the number of most significant bits to be taken from the output of the second register, and the simplicity of synthesizer's structure. Indeed, the digital control signal obtained at the output of the second register will have to be converted into an analog signal before being applied to the low-pass filter and subsequently to the adjusting input of the oscillator. This conversion is realized by means of a D/A converter having a structure which is all the more complex as the size of the digital word to be converted is larger. In a particular case, it may be sufficient to choose the sign bit of the output of the second register for constituting the control signal, thus precluding the necessity of a D/A conversion.

A particular embodiment of the invention thus provides a frequency synthesizer as described above, which is characterized in that the control signal is constituted by the bit indicating the sign of the signal which is present at the data output of the second register.

Such a synthesizer is particularly well adapted to applications of reception from a communication network, of signals from which the input signal, which may have been used for the elaboration of the received signals, is extracted, applications in which one wishes to generate a new signal on the basis of the input signal in order to rhythm the modulation of a signal to be transmitted back to the communication network. The invention thus also relates to an interface device between a terminal station and a communication network through which digital data are transmitted, comprising:

a module intended to generate a clock signal within the device, a tuner allowing selection of a data signal from the network, a digital demodulator rhythmed by the clock signal and intended to receive the data signal from the network and to generate, on the basis of said signal, a signal having an average frequency referred to as symbol frequency and a demodulated data signal, a first and a second register intended to comprise a first and a second predetermined value, respectively, a frequency synthesizer intended to generate a signal having a frequency referred to as output frequency, the ratio between the output frequency and the symbol frequency being substantially equal to the ratio between the first and second predetermined values, a digital modulator rhythmed by the output signal of the frequency synthesizer and intended to transmit another data signal to the network, characterized in that the frequency synthesizer is a synthesizer as described above.

These and other aspects of the invention are apparent from and will be elucidated with reference to the embodiments described hereinafter.

DETAILED DESCRIPTION OF THE PREFERRED EMBODIMENTS

Figure 1:
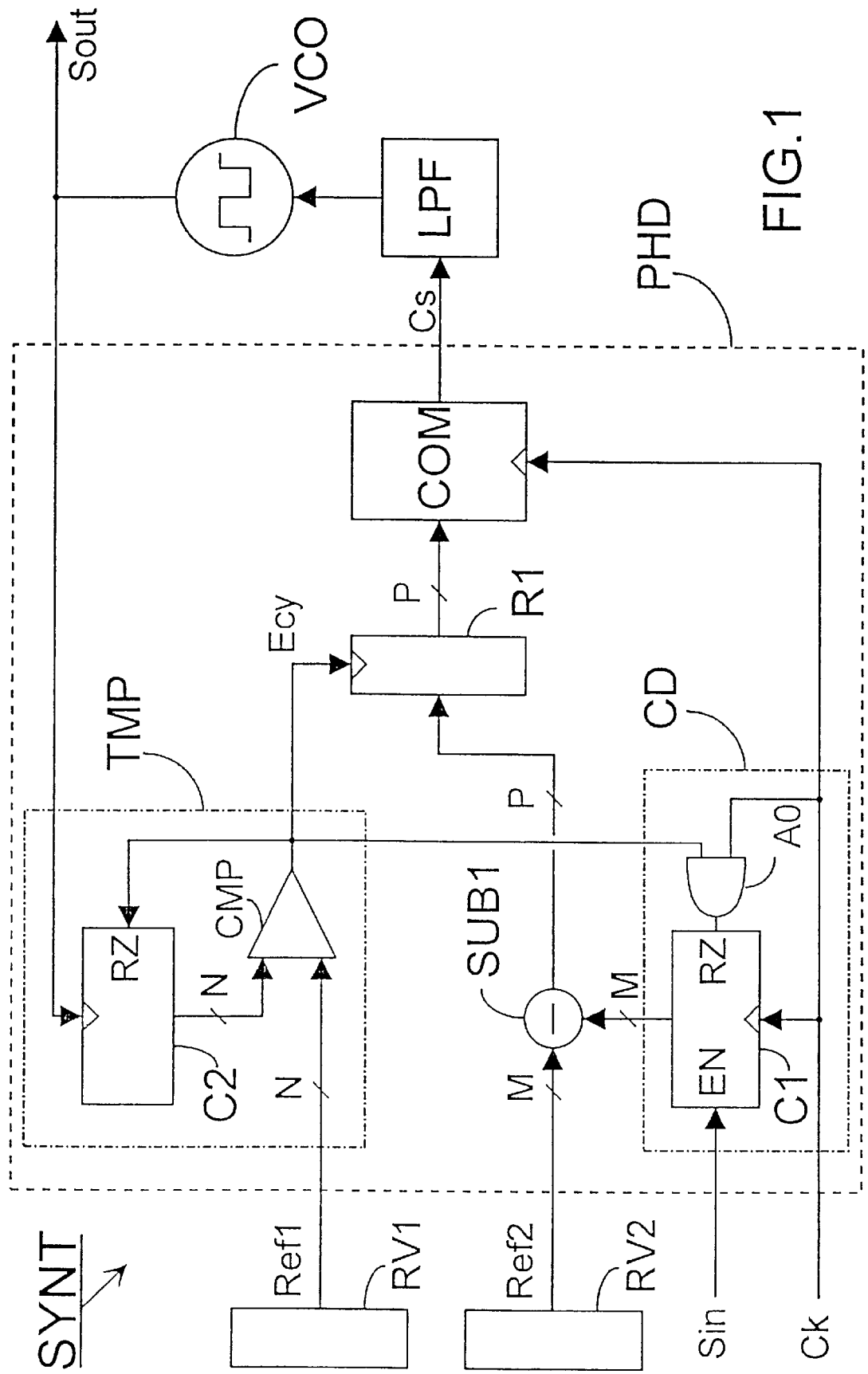
FIG. 1 is a diagram partially showing a frequency synthesizer in accordance with an embodiment of the invention.

FIG. 1 is a partial electric circuit diagram of a frequency synthesizer SYNT according to the invention, intended to receive an input signal Sin having an average frequency Fsym referred to as symbol frequency, a clock signal Ck having a fixed frequency, and to supply an output signal Sout having a frequency referred to as output frequency Fout, said synthesizer SYNT comprising:

a phase/frequency detector PHD intended to compare the symbol frequency Fsym with a predetermined fraction of the output frequency Fout and to supply a control signal Cs for adjusting the value of said output frequency Fout, a low-pass filter LPF having an output and an input intended to receive the control signal Cs, an oscillator VCO having a control input which is connected to the output of the low-pass filter LPF and an output which is intended to supply the output signal Sout of the synthesizer SYNT, whose output frequency Fout depends on the signal at the control input. In this frequency synthesizer SYNT, the phase/frequency detector PHD comprises:

a time delay module TMP intended to supply a signal Ecy referred to as end-of-cycle signal assuming an active state at the end of a period referred to as counting cycle which is equal to the multiplication of the duration of a period of the output signal Fout of the synthesizer SYNT by a first predetermined digital value Ref1, a counting device CD having a clock input which is intended to receive the clock signal Ck, an output having a value which is incremented, when the counting device CD is activated, at each new period of said clock signal, the counting device being only activated when the input signal of the synthesizer has an active logic state, the value of the output of the counting device being re-initialized when the end-of-cycle signal is in the active state, comparison means SUB1 allowing a comparison of the value obtained at the output of the counting device at the end of the counting cycle with a second predetermined digital value Ref2, the result of this comparison being used for generating the control signal Cs.

In this particular embodiment, the counting device CD comprises a first counter C1 having a clock input which receives the clock signal Ck, an output coded at M bits constituting the output of the counting device CD, a counting enable input EN intended to receive the input signal Sin, a zero-reset input RZ connected to the output of a logic AND gate A0 having two inputs, with the end-of-cycle signal Ecy being received at one input and the clock signal Ck at the other input.

The time delay module TMP comprises a second counter C2 provided with a clock input which is intended to receive the output signal Sout of the synthesizer SYNT, a zero-reset input RZ and an output coded at N bits. The time delay module TMP also comprises a digital comparator CMP having a first input which is intended to receive the first predetermined digital value Ref1, here coming from a register RV1 of N bits, a second input connected to the output of the second counter C2, and an output connected to the zero-reset input RZ and intended to supply the end-of-cycle signal Ecy which assumes an active state when the signals received at the inputs of the comparator CMP have equal values.

The comparison means included in the phase/frequency detector PHD comprise a first digital subtracter SUB1 having a first input which is intended to receive the output of the first counter C1, a second input which is intended to receive the second predetermined digital value Ref2, here coming from a register RV2 of M bits, and an output coded at P bits and connected to a first register R1 of P bits and rhythmed by the end-of-cycle signal Ecy. The control module COM receives the output of the register R1 and generates the control signal Cs.

In the transitory mode, the counter C1 counts the number of reference pulses, i.e. the number of active edges of the clock signal Ck which are validated by an active state of the input signal Sin, whose average frequency is the symbol frequency Fsym, and which occur during a counting cycle. The duration of the counting cycle is equal to Ref1/Fout, in which Fout is the frequency of the output signal Sout. The output of the counter C1 is permanently compared with the second predetermined digital value Ref2 by means of the subtracter SUB1, whose output indicates the magnitude of the difference between Ref2 and the value of the output of the counter C1. At the end of the counting cycle, the output of the comparator CMP assumes the active logic state and causes the second counter C2 to be reset to zero. After this has been effected and after a new comparison, the output of the comparator CMP resumes the inactive logic state. This pulse at the output of the comparator CMP is thus expressed by an active edge of the end-of-cycle signal Ecy, which causes the output of the subtracter SUB1 to be memorized, and subsequently, at the active edge of the next clock signal, causes the first counter Cl to be reset to zero. The contents of the register R1 accounts for the magnitude of the correction to be performed on the output frequency. The control module COM thus generates, on the basis of the value stored in the register R1, a control signal Cs allowing adjustment of the value of the output frequency in a view of obtaining the zero value at the output of the subtracter SUB1 at the end of a counting cycle. If, for example, the value of the output of the first counter C1 is smaller than the second digital reference value Ref2 at the end of the counting cycle, the control signal Cs will act on the oscillator VCO in such a way that the output value of the subtracter SUB1 closes towards zero at the end of the next counting cycle. After a certain number of counting cycles, a permanent mode is reached, in which the output value of the subtracter SUB1 averages zero at the end of each counting cycle. The conditions of obtaining this permanent mode may thus be defined by the equation Fout=Fsym.Ref1/Ref2.

The reset-to-zero of the first counter C1 at the end of the counting cycle may induce an error in the value of the symbol frequency as described above. Indeed, said frequency must be representative of a statistic average of the variations of the frequency of the input signal Sin. However, if an active state of the end-of-cycle signal Ecy occurs before an active edge of the clock signal Ck during an active state of the input signal Sin, the latter cannot generate a reference pulse to be accounted for by the first counter C1 because the output of this counter will be reset to the inactive logic state at the next active edge of the clock signal Ck. It is thus desirable to memorize the logic state which the input signal Sin has at the instant when the first counter C1 is re-initialized so that the output of said counter correctly represents the number of received reference pulses.

Figure 2:
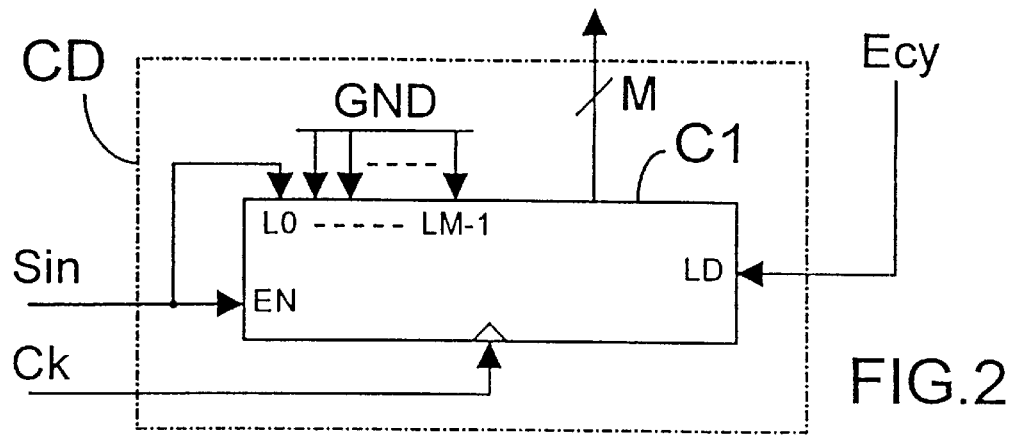
FIG. 2 is a diagram partially showing a counting device included in a frequency synthesizer in accordance with another embodiment of the invention.

FIG. 2 is a partial electric circuit diagram of a counting device in which the logic state which the input signal Sin has at the instant when the first counter C1 is re-initialized is memorized. In this device, the first counter C1 has a load input L[0:M-1] whose least significant bit L0 receives the input signal Sin and the other bits L1, . . . LM-1 are put in the inactive logic state constituted, in this case, by the ground potential GND of the circuit. The first counter C1 also has a re-initialization input LD intended to receive the end-of-cycle signal Ecy. An active state at the input LD commands the loading at the output of the counter with the value present at its load input L[0:M-1]. At the end of the counting cycle, the logic state of the input signal Sin is thus memorized and constitutes the state of the least significant bit of the output of the first counter C1 at the start of its new counting cycle.

The signal stored in the first register R1 is constituted by P bits of which, in most cases, only some are significant. Indeed, the closer the synthesizer gets to its permanent mode, the smaller the differences between the magnitudes of successive corrections, and thus between the successive contents of the register R1, become. It may thus be advantageous to provide, within the control module COM, a device performing a comparison between the contents of the first register R1 at the end of a counting cycle and the magnitude of the correction controlled at the end of the preceding cycle.

Figure 3:
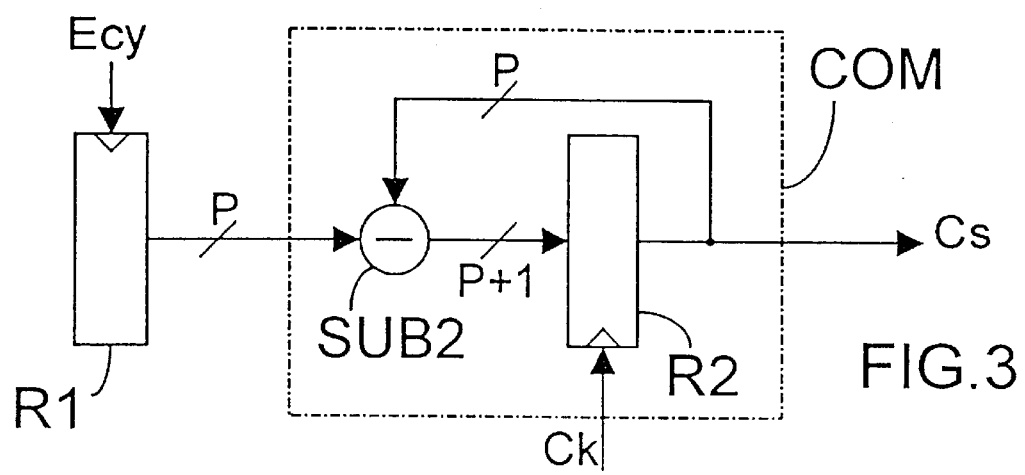
FIG. 3 is a diagram partially showing a control module included in a frequency synthesizer in accordance with a variant of the invention.

FIG. 3 is a partial electric circuit diagram of a control module integrating such a device. This control module comprises a second register R2 having a data output coded at P+1 bits supplying the control signal Cs, and a second digital subtracter SUB2 having a first input of P bits connected to the data output of the first register R1, a second input of P bits receiving the P least significant bits from the data output of the second register R2, and an output coded at P+1 bits, the supplementary bit being a sign bit and thus constituting the most significant bit of the output of the subtracter SUB2. The state of this output is memorized in the second register R2 in rhythm with the frequency of the clock signal Ck.

A compromise must be found between the precision of correction which one wishes to obtain, which is expressed by the number of most significant bits taken from the output of the second register R2, and the simplicity of the structure of the synthesizer. Indeed, the digital control signal Cs obtained at the output of the second register R2 should, in principle, be converted into an analog signal before it is applied to the low-pass filter LPF and subsequently to the adjusting input of the oscillator VCO. This conversion is then realized by means of a D/A converter having a structure which is all the more complex as the size of the digital word to be converted is larger. In the particular case illustrated in FIG. 3, only the sign bit of the output of the second register R2 is chosen to constitute the control signal Cs, which precludes the necessity of a D/A conversion. When the synthesizer is at the start of the transitory mode as described above, the register R1 has a large output value because it is representative of the difference between the value at the output of the first counter C1 at the end of the counting cycle and the second predetermined digital value Ref 2. When the first cycle is concerned, the contents of the register R2 are zero by hypothesis, because of the initialization of the system. The value at the output of the second subtracter SUB2 will thus be negative and large in absolute value. The sign bit Cs thus assumes the active state and the oscillator VCO receives a command causing the output frequency Fout to decrease. At the end of the next cycle, the difference between the value at the output of the first counter C1 and the second predetermined reference value Ref 2, is reduced and the output value of the first register R1 is smaller. The value at the output of the second subtracter SUB2 thus becomes positive and small in absolute value. The sign bit Cs resumes the inactive state and does not cause a change of the output frequency Fout. At the end of the next cycle, the difference between the value at the output of the first counter C1 and the second predetermined digital value Ref 2 is substantially unchanged so that the output value of the first register R1 is substantially identical to that in the preceding cycle, while the absolute value of the output of the second register R2 has considerably decreased because of the preceding subtraction. The value at the output of the subtracter SUB2 thus becomes negative again and relatively large in absolute value, although smaller than during the first iteration. The sign bit Cs thus assumes the active state and the oscillator VCO receives a command causing the output frequency Fout to decrease. The synthesizer thus evolves by way of successive iterations until it reaches the permanent mode. The low-pass filter LPF has an averaging effect and allows smoothing of the control signal by attenuating the abrupt character of the digital pulses constituting the control signal Cs, which may generate noise and be detrimental to the adjusting precision and the stability of the output frequency which one wishes to obtain in the permanent mode.

Figure 4:
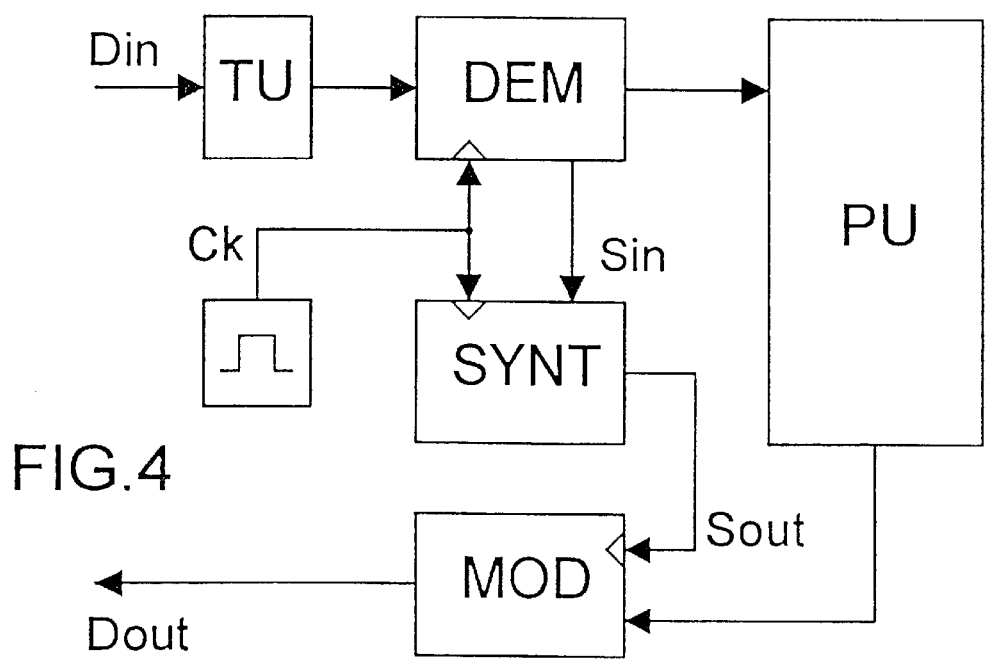
FIG. 4 is a diagram partially showing an interface device comprising a frequency synthesizer according to the invention.

FIG. 4 is a partial electric circuit diagram of a device in which the invention is used. It is an interface device between a terminal station and a communication network through which digital data are transmitted, comprising:

a module intended to generate a clock signal Ck within the device, a tuner TU allowing selection of a data signal Din from the network, a digital demodulator DEM rhythmed by the clock signal Ck and intended to receive the data signal Din from the network and to generate, on the basis of said signal, a signal Sin having an average frequency Fsym referred to as symbol frequency and a demodulated data signal, which is intended to be used by a processing unit PU of the terminal station, a frequency synthesizer SYNT as described above, intended to generate a signal Sout having an output frequency Fout which is controllable as a function of the symbol frequency Fsym, a digital modulator MOD rhythmed by the output signal Sout of the frequency synthesizer SYNT and intended to transmit another data signal Dout to the network, elaborated, in this example, on the basis of a signal coming from the processing unit PU.

The use of the synthesizer SYNT allows modulation of the signal to be transmitted by means of the signal Sout having a frequency as a function of the symbol frequency Fsym. The recipient of the data signal Dout thus transmitted will thus be capable of easily identifying the frequency to be used for demodulating said signal.

I claim:

1. A frequency synthesizer intended to receive an input signal having an average frequency referred to as symbol frequency and a clock signal having a fixed frequency, and to supply an output signal having a frequency referred to as output frequency, said synthesizer comprising:

a phase/frequency detector intended to compare the symbol frequency with a predetermined fraction of the output frequency and to supply a control signal for adjusting the value of said output frequency;

a low-pass filter having an output and an input intended to receive the control signal;

an oscillator having a control input which is connected to the output of the low-pass filter and an output which is intended to supply the output signal of the synthesizer whose output frequency depends on the signal at the control input;

characterized in that the phase/frequency detector comprises:

a time delay module intended to supply a signal referred to as end-of-cycle signal assuming an active state at the end of a period referred to as counting cycle which is equal to the multiplication of the duration of a period of the output signal of the synthesizer by a first predetermined digital value;

a counting device having a clock input which is intended to receive the clock signal, an output having a value which is incremented, when the counting device is activated, at each new period of said clock signal, the counting device being only activated when the input signal of the synthesizer has an active logic state, the value of the output of the counting device being re-initialized when the end-of-cycle signal is in the active state; and comparison means allowing a comparison of the value obtained at the output of the counting device at the end of the counting cycle with a second predetermined digital value, the result of this comparison being used for generating the control signal.

2. A frequency synthesizer as claimed in claim 1, characterized in that the counting device comprises a first counter provided with a clock input which is intended to receive the clock signal, an output constituting the output of the counting device, a counting enable input intended to receive the input signal, a load input whose least significant bit is coupled to said enable input and whose other bits are placed in the inactive logic state, and a re-initialization input intended to receive the end-of-cycle signal, an active state of which controls the loading at the output of the counter with the value present at its load input.

3. A frequency synthesizer as claimed in claim 1, characterized in that the comparison means included in the phase/frequency detector comprise a first digital subtracter having a first input which is intended to receive the output of the counting device, a second input which is intended to receive the second predetermined digital value, and an output connected to a first register memorizing the state of said output at the start of each counting cycle, said first register being intended to supply a signal used for generating the control signal.

4. A frequency synthesizer as claimed in claim 1, characterized in that the time delay module comprises a second counter provided with a clock input which is intended to receive the output signal of the synthesizer, a zero-reset input and an output, a digital comparator having a first input which is intended to receive the first predetermined digital value, a second input connected to the output of the second counter, and an output connected to the zero-reset input and intended to supply the end-of-cycle signal which assumes an active state when the signals received at the inputs of the comparator have equal values.

5. A frequency synthesizer as claimed in claim 3, characterized in that the phase/frequency detector includes a control module comprising a second register which has a data output from which the control signal is derived, and a second digital subtracter having a first input which is connected to the data output of the first register, a second input which is connected to the data output of the second register, and an output whose state is memorized in the second register in rhythm with the frequency of the clock signal.

6. A frequency synthesizer as claimed in claim 5, characterized in that the control signal is constituted by the bit indicating the sign of the signal which is present at the data output of the second register.

7. An interface device between a terminal station and a communication network through which digital data are transmitted, comprising:

a module intended to generate a clock signal within the device;

a tuner allowing selection of a data signal from the network;

a digital demodulator rhythmed by the clock signal and intended to receive the data signal from the network and to generate, on the basis of said signal, a signal having an average frequency referred to as symbol frequency and a demodulated data signal;

a first and a second register intended to comprise a first and a second predetermined value, respectively;

a frequency synthesizer intended to generate a signal having a frequency referred to as output frequency, the ratio between the output frequency and the symbol frequency being substantially equal to the ratio between the first and second predetermined values; and a digital modulator rhythmed by the output signal of the frequency synthesizer and intended to transmit another data signal to the network;

characterized in that the frequency synthesizer is a synthesizer as claimed in claim 1.

* * * * *